(12) United States Patent
Baker

(10) Patent No.: US 6,914,454 B2
(45) Date of Patent: Jul. 5, 2005

(54) HIGH SPEED LOW POWER INPUT BUFFER

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 10/627,536

(22) Filed: Jul. 25, 2003

(65) Prior Publication Data

US 2004/0017231 A1 Jan. 29, 2004

Related U.S. Application Data

(62) Division of application No. 10/174,206, filed on Jun. 17, 2002, now Pat. No. 6,600,343, which is a division of application No. 09/649,555, filed on Aug. 28, 2000, now Pat. No. 6,407,588.

(51) Int. Cl.[7] .......................... G01R 19/00; H03B 1/00; G06F 17/50
(52) U.S. Cl. .......................... 327/55; 327/56; 328/108; 716/1
(58) Field of Search .................. 327/52–58, 65, 327/108, 112, 560, 563

(56) References Cited

U.S. PATENT DOCUMENTS

| | | | |
|---|---|---|---|
| 5,235,550 A | 8/1993 | Zagar | 365/226 |
| 5,280,198 A | 1/1994 | Almulla | 307/296 |
| 5,309,047 A | 5/1994 | Tiede et al. | 307/530 |
| 5,694,035 A | 12/1997 | Keeth | 323/349 |
| 5,698,972 A | 12/1997 | Keeth | 323/349 |
| 5,748,021 A | 5/1998 | Hunt et al. | 327/312 |
| 5,783,957 A | 7/1998 | Yamauchi | 327/53 |
| 5,798,967 A | 8/1998 | Sarin et al. | 365/185.21 |
| 5,838,150 A | 11/1998 | Keeth | 323/349 |
| 5,872,736 A | 2/1999 | Keeth | 365/189.05 |
| 5,874,830 A | 2/1999 | Baker | 323/316 |
| 5,910,920 A | 6/1999 | Keeth | 365/189.05 |
| 5,953,276 A | 9/1999 | Baker | 365/208 |
| 5,963,060 A | * 10/1999 | Varadarajan et al. | 327/55 |
| 6,018,236 A | 1/2000 | Keeth | 323/313 |
| 6,026,051 A | 2/2000 | Keeth et al. | 365/233 |
| 6,034,568 A | 3/2000 | Bonaccio et al. | 330/253 |
| 6,037,808 A | 3/2000 | Houston et al. | 327/55 |
| 6,084,444 A | 7/2000 | Menezes | 327/112 |
| 6,097,242 A | 8/2000 | Forbes et al. | 327/537 |
| 6,108,237 A | 8/2000 | Briner | 365/185.21 |
| 6,114,898 A | 9/2000 | Okayasu | 327/437 |
| 6,127,853 A | 10/2000 | Yu | 327/55 |
| 6,140,877 A | 10/2000 | Forbes | 330/258 |
| 6,215,331 B1 | 4/2001 | Setty et al. | 327/51 |
| 6,281,714 B1 | * 8/2001 | Ang et al. | 327/56 |
| 6,288,575 B1 | 9/2001 | Forbes | 327/57 |
| 6,377,084 B1 | 4/2002 | Forbes | 327/55 |

OTHER PUBLICATIONS

Bazes, M., "Two Novel Fully Complementary Self–Biased CMOS Differential Amplifiers", *IEEE Journal of Solid–State Circuits*, 26(2), (1991), pp. 165–168.

* cited by examiner

*Primary Examiner*—Matthew Smith
*Assistant Examiner*—Paul Dinh
(74) *Attorney, Agent, or Firm*—Schwegman, Lundberg, Woessner & Kluth, P.A.

(57) ABSTRACT

The input buffer circuit includes an input stage providing a switching point voltage based on a predetermined switching point set between a first and second reference voltages that maximizes the high and low noise margins of the input buffer. The input buffer circuit further includes an output stage. The output stage is coupled to the input stage. The output stage receives the switching point voltage from the input stage and amplifies the switching point voltage to a full logic level voltage.

8 Claims, 8 Drawing Sheets

HIGH SPEED LOW POWER INPUT BUFFER

CROSS-REFERENCE TO RELATED APPLICATION(S)

This patent application is a division of U.S. patent application Ser. No. 10/174,206, filed on Jun. 17, 2002 now U.S. Pat. No. 6,600,343, which is a division of U.S. patent application Ser. No. 09/649,555, filed on Aug. 28, 2000, now U.S. Pat. No. 6,407,588 both of which are incorporated herein by reference.

FIELD OF THE INVENTION

The present invention relates generally to integrated circuits. More particularly, it pertains to differential amplifiers including input buffers.

BACKGROUND OF THE INVENTION

Differential amplifiers are commonly used in memory devices as input buffers to couple data signals between a memory array and data terminals of the memory devices. Generally, one common problem with these input buffers is the setting of a switching point voltage to maximize the switching response of the input buffers. Switching point voltage refers to the point at which the input and output voltages are transitioning from a high state-to-low state or a low state-to-high state. If the switching point voltage goes too high, the bits of data coming out of the input buffer will have a good low noise margin, but will not have a high noise margin similarly, if the switching point voltage goes too low, the bits of data will have a good high noise margin, but will not have a good low noise margin. If the switching point voltage is too high or too low, the bits of data coming out of the input buffer can be distorted. For example, if we were to input a voltage in a digital wave form having a sloping rise and fall times like a triangular wave, and if the switching point voltage is too high or too low, the bits of data coming out of the input buffer can be of varying widths and can cause timing problems in the input buffer.

Thus, there is a need for an input buffer that can automatically establish a switching point voltage that maximizes the high and low noise margins of an integrated circuit. There is also a need for input buffers used in memories of computers to transfer data at a faster rate using low power. Therefore, there is also a need for a low power high-speed input buffer that is capable of operating at high speeds, while using low power.

SUMMARY OF THE INVENTION

The input buffer of the present invention provides, among other things, provides a mechanism to accurately establish a switching point voltage that maximizes the high and low noise margins of an integrated circuit, while using a low power. Also the input buffer is capable of operating at high speeds. According to one embodiment, the input buffer has an input stage providing a switching point voltage based on a predetermined switching point set between first and second reference voltages that maximizes the high and low noise margins of the input buffer. The input buffer further includes an output stage. The output stage is coupled to the input stage. The output stage receives the switching point voltage from the input stage and amplifies the switching point voltage to a full logic level voltage.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents. Other aspects of the invention will be apparent on reading the following detailed description of the invention and viewing the drawings that form a part thereof.

DESCRIPTION OF THE EMBODIMENTS

Figure 1:
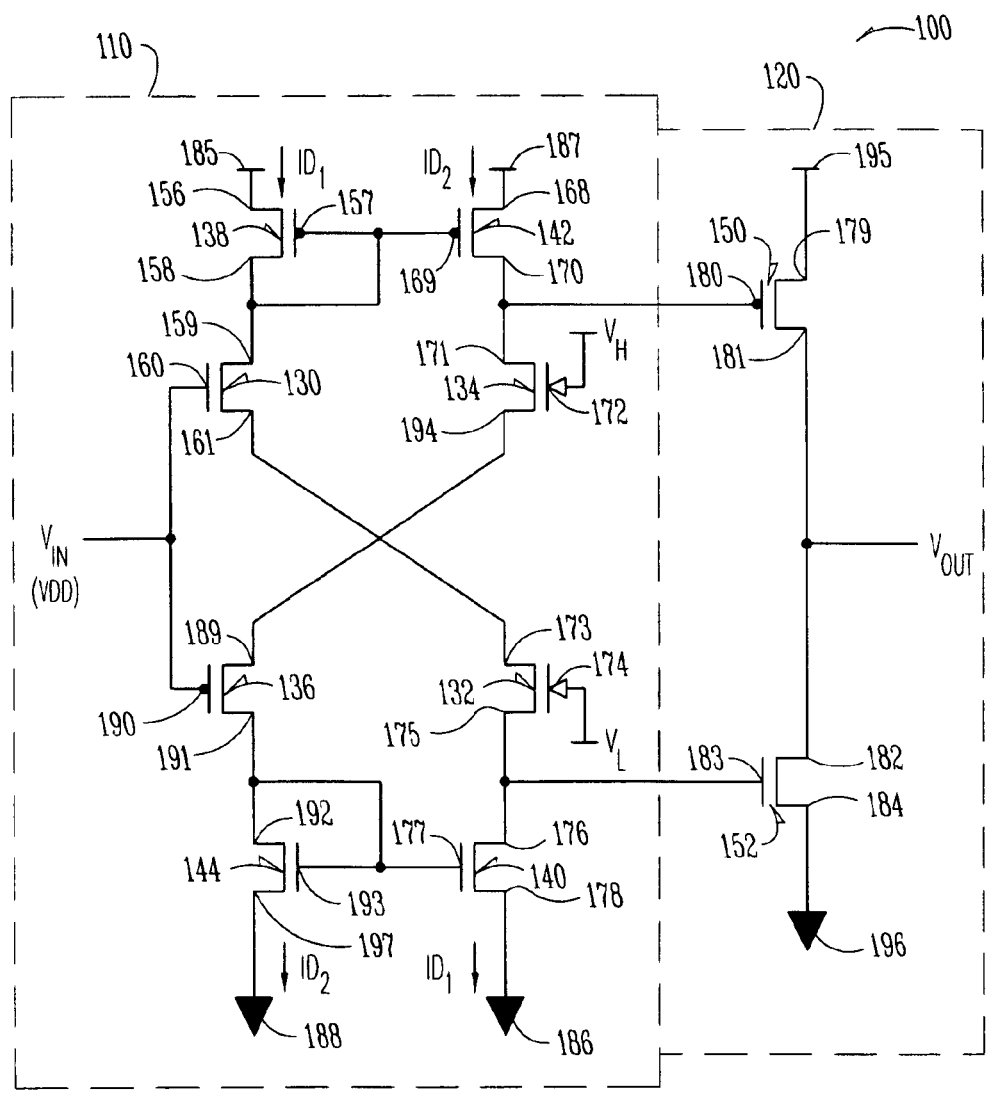
FIG. 1 is a schematic diagram illustrating generally one embodiment of an input buffer of the present invention.

In the following detailed description of the invention, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is designed only by the appended claims, along with the full scope of equivalents to which such claims are entitled.

The transistors described herein are N-channel metal-oxide-semiconductor (NMOS) and P-channel metal-oxide-semiconductor (PMOS). A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense.

The embodiments of the present invention provide a mechanism to set a predetermined switching point for a switching point voltage which maximizes the high and low noise margins of an integrated circuit. Also the input buffer circuit of the present invention uses low power. This is because the differential amplifier of the present invention behaves like an inverter by drawing current only during switching. The present invention is capable of operating at high speeds to meet the needs of today's computers and computing circuitry which requires a memory that transfers data at a faster rate using low power. High operating speeds are achieved by not having the current source in series with the differential amplifier. Having current source in series with the differential amplifier, causes a slew rate limitation. To overcome the problem of slew rate limitation, the differential amplifier requires a large current source to charge-up quickly the input capacitance of a next stage, which is generally not desirable.

FIG. 1 is a schematic diagram of one embodiment of an integrated circuit according to the teachings of the present invention. In particular, FIG. 1 illustrates an input buffer circuit 100. The input buffer circuit 100 shown in FIG. 1 includes an input stage 110 and an output stage 120. The input stage 110 includes a first pair of NMOS and PMOS transistors 130 and 132, a second pair of NMOS and PMOS transistors 134 and 136, a third pair of PMOS and NMOS transistors 138 and 140, and a fourth pair of PMOS and NMOS transistors 142 and 144. The output stage 120 includes a fifth pair of PMOS and NMOS transistors 150 and 152, respectively.

Description of Connectivity of the Input Buffer Circuit:

The first pair of NMOS and PMOS transistors 130 and 132 are coupled between a first current source node and a first current sink node 185 and 186, respectively, in which a drain 159 of the NMOS transistor 130 is coupled to the first current source node 185, a drain 175 of the PMOS transistor 132 is coupled to the first current sink node 186. A 161 source of the NMOS transistor 130 is coupled to a source 173 of the PMOS transistor 132, and a gate 174 of the PMOS transistor 132 is coupled to receive a second reference voltage ($V_I$).

The second pair of NMOS and PMOS transistors 134 and 136 are coupled between a second current source node 187 and a second current sink node 188, in which a drain 171 of the NMOS transistor 134 is couple to the second current source node 187, a drain 191 of the PMOS transistor 136 is coupled to the second current sink node 188, a source 194 of the NMOS transistor 134 is coupled to a source 189 of the PMOS transistor 136, a gate 172 of the NMOS transistor 134 is coupled to receive a first reference voltage ($V_H$), and the gates 160 and 190 of the first pair NMOS transistor 130 and the second pair PMOS transistor 136 are coupled to each other and to a input terminal ($V_{DD}$) to receive the supply voltage from a power source. $V_L$ and $V_H$ are effectively utilized in the present invention to maximize the switching point voltage.

The third pair of PMOS and NMOS transistors 138 and 140 are coupled between the first current source node 185 and the first current sink node 186, in which a source 156 of the PMOS transistor 138 is coupled to the first current source node 185, a drain 158 of the PMOS transistor 138 is coupled to the drain 159 of the first pair NMOS transistor 130, a drain 176 of the NMOS transistor 140 is coupled to the drain 175 of the first pair PMOS transistor 132, and a source 178 of the NMOS transistor 140 is coupled to the first current sink node 186.

The fourth pair of PMOS and NMOS transistors 142 and 144 are coupled between the second current source node 187 and the second current sink node 188, in which a source 168 of the PMOS transistor 142 is coupled to a second current source node 187, a drain 170 of the PMOS transistor 142 is coupled to the drain 171 of the second pair NMOS transistor 134, a gate 169 of the PMOS transistor 142 is coupled to the gate 157 of the third pair PMOS transistor 138 and further the gates 157 and 169 of the third and fourth PMOS transistors 138 and 142 are coupled to the drain 159 of the first pair NMOS transistor 130, a drain 192 of the NMOS transistor 144 is coupled to the drain 191 of the second pair PMOS transistor 136, a source 197 of the NMOS transistor 144 is coupled to the second current sink node 188, a gate 193 of the NMOS transistor 144 is coupled to the gate 177 of the third pair NMOS transistor 140, the gate 177 of the third PMOS transistor 140 and a gate 193 of the PMOS transistor 144 are coupled to the drain 191 of the second pair PMOS transistor 136.

The fifth pair of PMOS and NMOS transistors 150 and 152 are coupled between a third current source node 195 and a third current sink node 196, wherein a source 179 of the PMOS transistor 150 is coupled to the third current source node 195, a gate 180 of the PMOS transistor 150 is coupled to the drain 171 of the second pair NMOS transistor 134 and further coupled to the drain 170 of the fourth pair PMOS transistor 142. Further a drain 182 of the NMOS transistor 152 is coupled to a drain 181 of the PMOS transistor 150 and the drain 182 of the NMOS transistor 152 and the drain 181 of the PMOS transistor 150 are coupled to a output terminal ($V_{OUT}$) to supply and to amplify the switching point voltage to a full logic level voltage, and a gate 183 of the NMOS transistor 152 is coupled to the drain 175 of the first pair PMOS transistor 132 and further coupled to the drain 176 of third pair NMOS transistor 140.

Description of Operation of the Input Buffer Circuit:

In this example embodiment, the input buffer circuit 100 including the NMOS transistors 130 and 134, and the PMOS transistors 136 and 132 are switched from a normal CMOS configuration, such that n-channels are on the top and p-channels are on the bottom. In FIG. 1 an input voltage is applied across two gate to source voltages. This input buffer circuit 100 of the present invention is unlike a normal inverter. That is the input buffer circuit 100 of the present invention is different in that an input voltage is applied parallel across the gate to source voltages. Applying the voltages across the gate to source voltages of the transistors provides an immunity from power supply voltage variations.

Figure 2A:
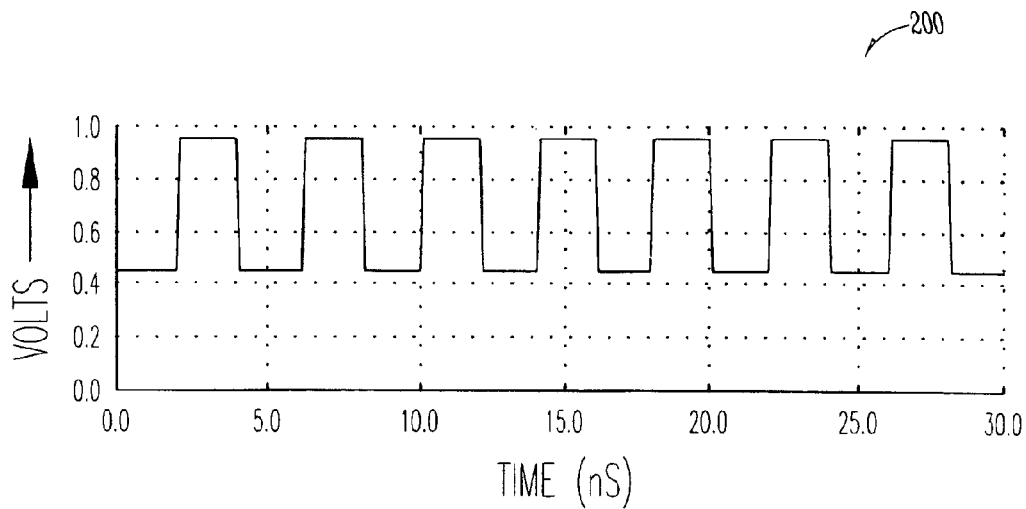
FIG. 2A is a timing diagram illustrating one embodiment of application of supply voltage to the input buffer circuit of the present invention.
Figure 2B:
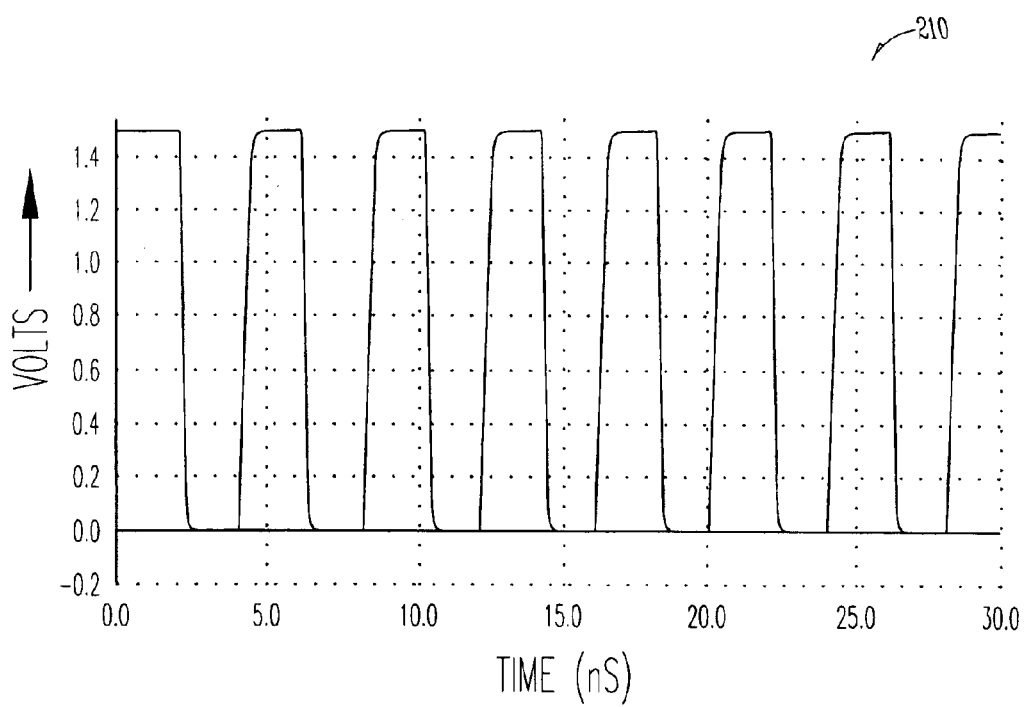
FIG. 2B is a timing diagram illustrating one embodiment of output voltage obtained from the input buffer circuit of the present invention when the supply voltage to the input buffer circuit is as shown in FIG. 2A.

When the input voltage ($V_{IN}$) to the input buffer circuit 100 goes high (i.e., above the switching point voltage), the gate to source voltage of NMOS transistor 130 increases and source to gate voltage of PMOS transistor 132 increases, this in-turn causes the current to increase in PMOS transistor 138, NMOS transistor 130, PMOS transistor 132, and NMOS transistor 140. This causes the voltage across the gate of NMOS transistor 152 to increase and the output to go low. Also when the input voltage is high, the source to gate voltage of PMOS transistor 136 and gate to source voltage of NMOS transistor 134 decreases. This causes the current in PMOS transistor 142 and NMOS transistor 144 to go to zero. This will cause the current to go through PMOS transistor 138, NMOS transistor 130, and PMOS transistor 132. This will in-turn cause the current decrease through NMOS transistor 140 and charge-up the gate of NMOS transistor 152. One of ordinary skill in the art will understand that the opposite occurs when the $V_{IN}$ goes low (i.e., goes below the switching point voltage). Essentially, in operation, the input buffer circuit 100 takes a low level input voltage (such as 100 millivolts peak to peak) and amplifies the input voltage to a full logic level output voltage ($V_{OUT}$). Also the input buffer circuit 100 of the present invention effectively utilizes the $V_L$ and $V_H$ to maximize the switching point voltage FIGS. 2A and 2B show timing diagrams 200 and 210 illustrating one embodiment of switching point voltage output obtained from the input buffer circuit 100 shown in FIG. 1. The timing diagram 200 in FIG. 2A, shows the application of the supply voltage ($V_{DD}$) to the input buffer circuit 100. In the embodiment shown in FIG. 2A, the $V_{DD}$ switches from 0.5 to 1.0 volts, and has a switching point voltage of around 0.75 volts. The timing diagram 210 shown in FIG. 2B, shows the output voltage ($V_{OUT}$) obtained from the output stage 120 of the input buffer circuit 100 when applying the $V_{DD}$ as shown in the timing diagram 200 of FIG. 2A. Timing diagrams 200 and 210 clearly show that the input stage and the output stage of the novel input buffer circuit 100 amplifies the $V_{DD}$ and the switching point voltage to a full logic level voltage.

Figure 3:
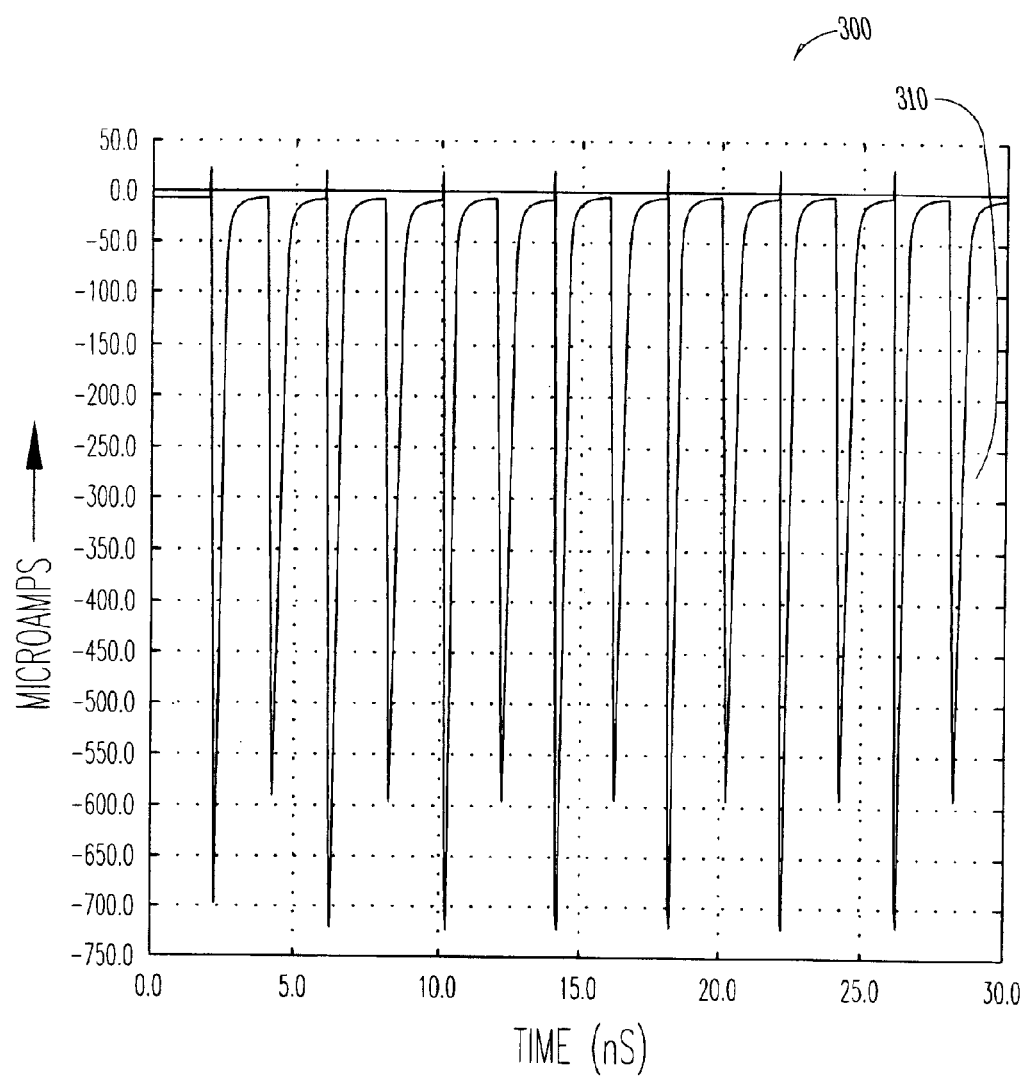
FIG. 3 is a timing diagram illustrating one embodiment of a current drawn by the input buffer of the present invention, when operating at 250 Mega Hertz.

FIG. 3 is a timing diagram 300 illustrating one embodiment of current draw by the input buffer circuit 100 of the present invention 300 when operating at 250 Mega Hertz. The timing diagram 300 shows that the input buffer circuit 100 essentially draws current only during switching. FIG. 3 shows current drawn as spikes 310 during switching and then drawing no current the rest of the time to conserve power. This timing diagram 300 shows that the input buffer circuit 100 of FIG. 1 uses low power by behaving like a conventional inverter and drawing current only during switching. However the novel input buffer circuit 100 of this present invention offers better noise immunity by having a more accurate/effective switching point voltage.

Figure 4:
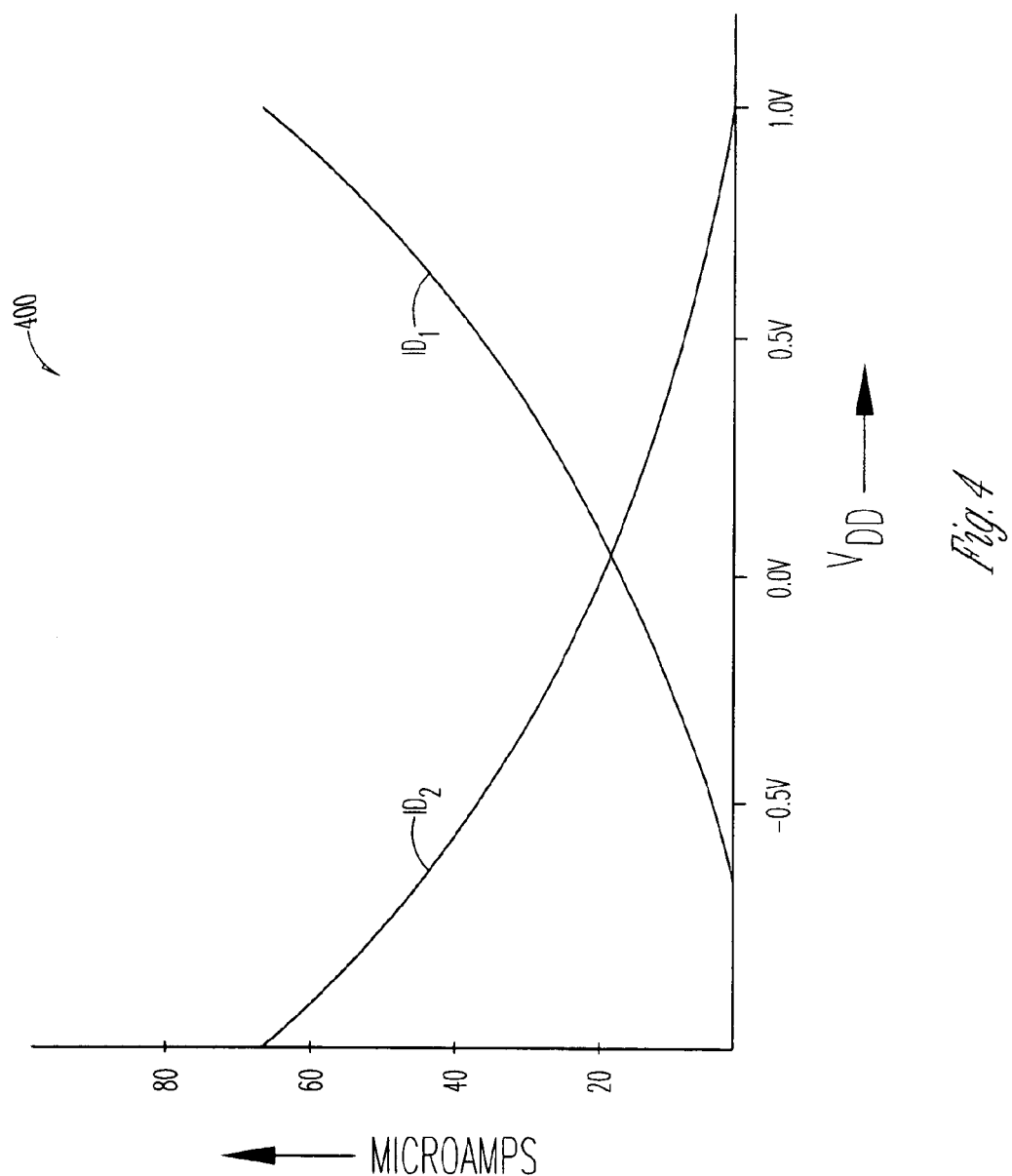
FIG. 4 is a graph illustrating one embodiment of current transfer characteristics of the input buffer of the present invention.

FIG. 4 is a graph 400 illustrating one embodiment of current versus voltage behavior of the input buffer according to the teachings of the present invention. One of ordinary skill in the art will understand that when $V_{DD}$ is applied to the input buffer circuit 100, the voltage across the first pair of transistors 130 and 132 increases. When the voltage across the first pair of transistors 130 and 132 increases, NMOS transistor 130 and PMOS transistor 132 are turned-on, and PMOS transistor 136 and NMOS transistor 134 are turned-off. This in-turn causes the current $ID_1$ (represents current drawn across first and third pair of transistors 130, 132 and 138,140 respectively as shown in FIG. 1) to increase exponentially and current $ID_2$ (represents current drawn across second and fourth pair of transistors 134, 136 and 142, 144 respectively as shown in FIG. 1) to decrease exponentially, as shown in FIG. 4. One of ordinary skill in the art will understand that the opposite occurs when the voltage across the first pair of transistors decreases and the voltage across the second pair of transistors 134 and 136 increases. One of ordinary skill in the art will also understand that in a normal differential amplifier the $ID_1$ will not increase more than the input current. Where as the input buffer circuit 100 of the present invention operates like a self-biased class AB input, where neither of the output currents $ID_1$ and $ID_2$ is zero as long as their magnitude remains less than the current through the fifth pair of PMOS and NMOS transistors 150 and 152.

Figure 5:
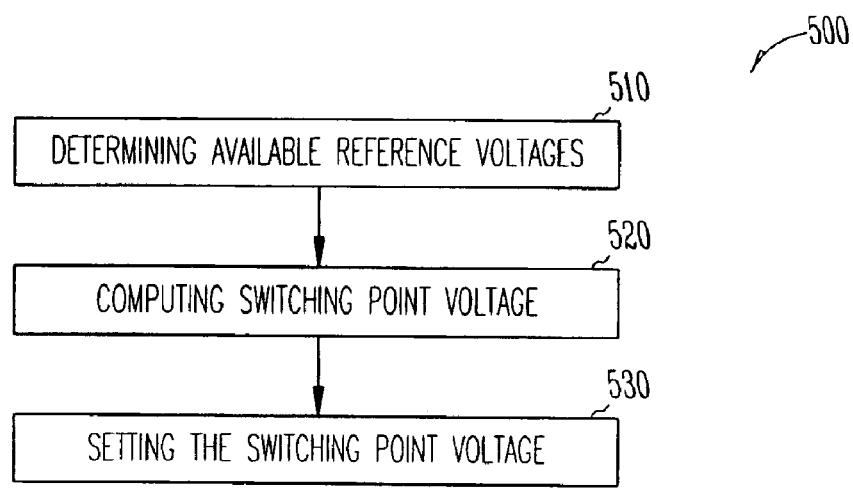
FIG. 5 is a flow diagram illustrating a method of providing a switching point voltage from the input buffer of the present invention.

FIG. 5 shows a method of providing a switching point voltage using the input buffer circuit 100 of the present invention. Method 500 begins with step 510 by determining available first and second reference voltages ($V_H$ and $V_L$) to the input buffer circuit 100. After determining the available $V_H$ and $V_L$ voltages, the next step 520 in the process includes computing a switching point voltage based on the available $V_H$ and $V_L$ voltages to maximize high and low noise margins of the input buffer circuit 100. In one embodiment, the switching point voltage is computed based on the average of the first and second reference voltages (($V_H+V_L$)/2). The next step 530 in the process includes setting the switching point voltage by sizing the transistors in the input buffer circuit 100, to provide the computed switching point voltage. In one embodiment, sizing the transistors in the input buffer circuit 100 includes selecting appropriate reference voltages based on using standard size transistors. In another embodiment, sizing the transistors in the input buffer circuit 100 includes using standard reference voltages $V_{DD}$ and ground. In one embodiment, the first reference voltage is set to $V_{DD}$. In one embodiment, the second reference voltage is set to zero by coupling the gate of the PMOS transistor 132 of the input stage 110 to ground. In another embodiment, providing a first reference voltage includes using a standard supply voltage $V_{DD}$ and sizing the transistors in the input buffer circuit 100 to obtain a desired switching point voltage.

Figure 6:
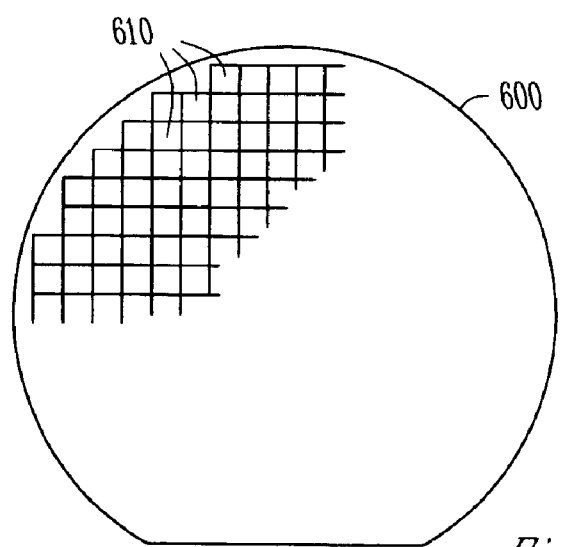
FIG. 6 is an elevation view of one embodiment of a substrate containing semiconductor dies including the input buffer of the present invention.

With reference to FIG. 6, in one embodiment, a semiconductor die 610 is produced from a silicon wafer 600. A die is an individual pattern, typically rectangular, on a substrate that contains circuitry to perform a specific function. A semiconductor wafer will typically contain a repeated pattern of such dies containing the same functionality. According to the teaching of the present invention, die 610 contains circuitry for the inventive input buffer, as discussed above. Die 610 may further contain additional circuitry to extend to such complex devices as a monolithic processor with multiple functionality. Die 610 is typically packaged in a protective casing (not shown) with leads extending therefrom (not shown) providing access to the circuitry of the die for unilateral or bilateral communication and control.

Figure 7:
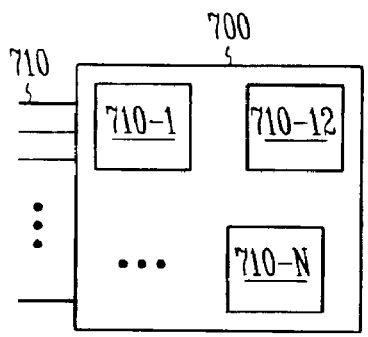
FIG. 7 is a block diagram of one embodiment of a circuit module including the input buffer of the present invention.

As shown in FIG. 7, two or more dies 710 may be combined, with or without protective casing, into a circuit module 700 to enhance or extend the functionality of an individual die 710-1. According to the teachings of the present invention at least one of the dies 710-1, 710-2, . . . , 710-N shown in FIG. 7, includes buffer circuit of the present invention. Circuit module 700 may be a combination of dies 710-1 representing a variety of functions, or a combination of dies 710-1 containing the same functionality. Some examples of a circuit module include input buffer, memory modules, device drivers, power modules, communication modems, processor modules and application-specific modules and may include multi-layer, multi-chip modules. Circuit module 700 may be a sub-component of a variety of electronic systems, such as a clock, a television, a cell phone, a personal computer, an automobile, an industrial control system, an aircraft and others. Circuit module 700 will have a variety of leads 710 extending therefrom providing unilateral or bilateral communication and control.

Figure 8:
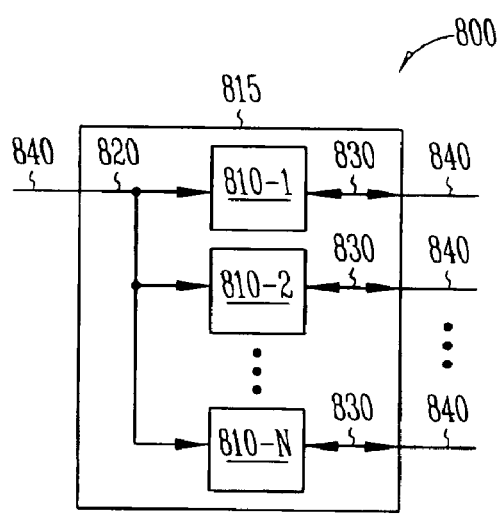
FIG. 8 is a block diagram of one embodiment of a memory module including the input buffer of the present invention.

FIG. 8 shows one embodiment of a circuit module as memory module 800. Memory module 800 generally depicts a Single In-line Memory Module (SIMM) or Dual In-line Memory Module (DIMM). A SIMM or DIMM is generally a printed circuit board (PCB) or other support containing a series of memory devices including input buffer circuit according to the teaching of the present invention. While a SIMM will have a single in-line set of contacts or leads, a DIMM will have a set of leads on each side of the support with each set representing separate I/O signals. Memory module 800 contains multiple memory devices 810-1, 810-2, ..., 810-N contained on support 815, the number depending upon the desired bus width and the desire for parity. According to the teachings of the present invention, memory module 800 include input buffer circuit of the present invention in a memory device 810-1, 810-2, ..., 810-N on both sides of support 815. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 7.

Figure 9:
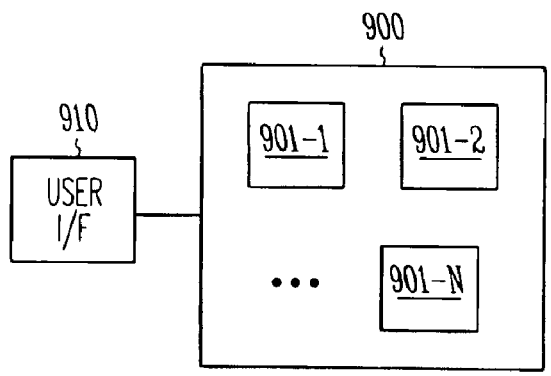
FIG. 9 is a block diagram of one embodiment of an electronic system formed according to the teachings of the present invention.

FIG. 9 shows an electronic system 900 includes one or more circuit modules 800 as described in FIG. 8. Electronic system 900 generally contains a user interface 910. User interface 910 provides a user of the electronic system 900 with some form of control or observation of the results of the electronic system 900. Some examples of user interface 910 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 910 may further describe access ports 901-1, 901-2, ..., 901-N provided to electronic system 900. Access ports 901-1, 901-2, ..., 901-N are used to connect an electronic system 900 to the more tangible user interface components previously exemplified. One or more of the circuit modules 800 includes the input buffer circuit according to the teachings of the present invention. One or more of the circuit modules may be a processor providing some form of manipulation, control or direction of inputs from or outputs to user interface 910, or of other information either preprogrammed into, or otherwise provided to, electronic system 900. As will be apparent from the lists of examples previously given, electronic system 900 will often contain certain mechanical components (not shown) in addition to circuit modules 800 including an input buffer circuit according to the teachings of the present invention and user interface 910. It will be appreciated that the one or more circuit modules 800 in electronic system 900 can be replaced by a single integrated circuit. Furthermore, electronic system 900 may be a sub-component of a larger electronic system.

Figure 10:
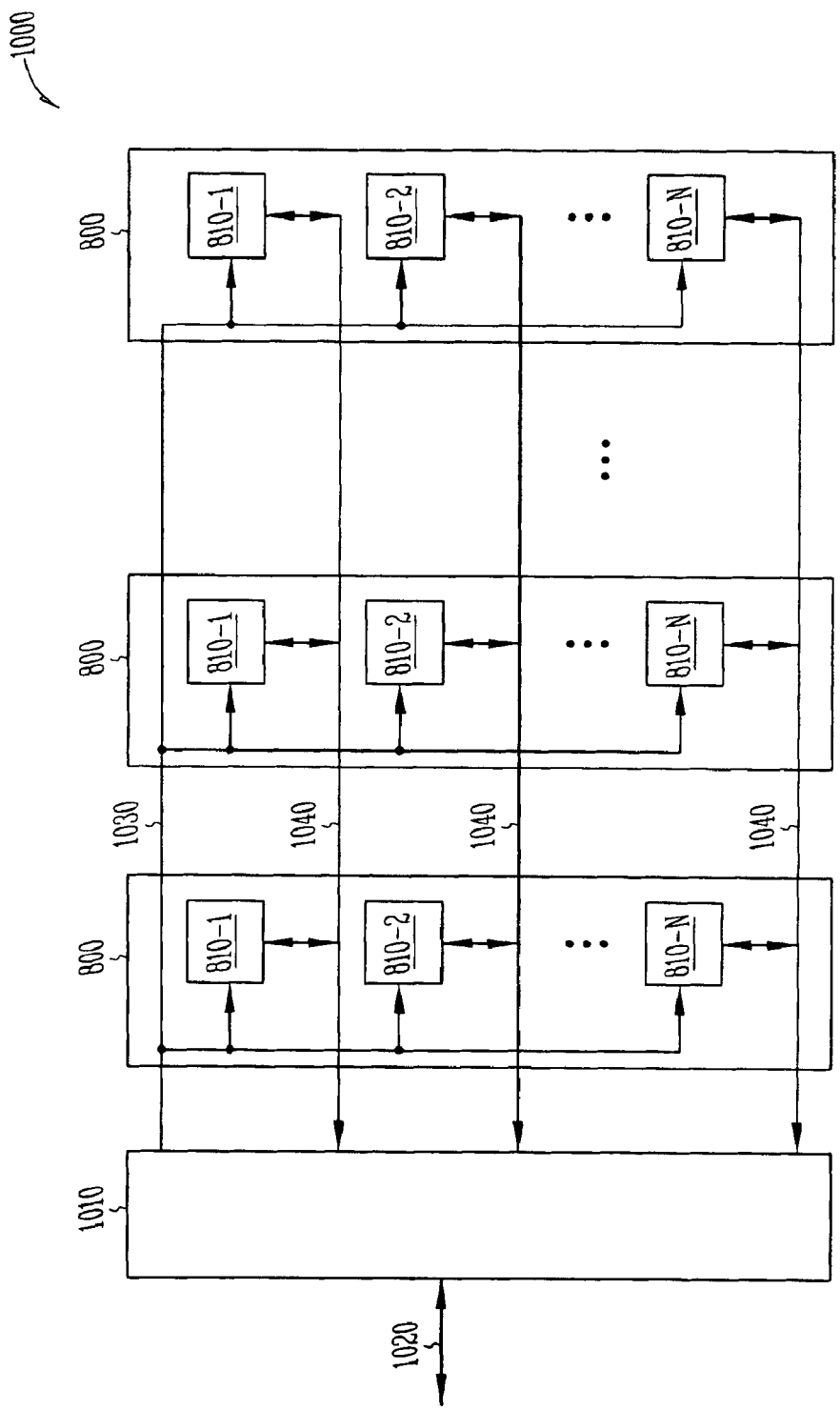
FIG. 10 is a block diagram of one embodiment of a memory system including the input buffer of the present invention.

FIG. 10 shows one embodiment of an electronic system as memory system 1000. Memory system 1000 contains one or more memory modules 800 such as memory modules described in connection with FIG. 8. One or more memory modules 800 includes an input buffer circuit according to the teachings of the present invention and a memory controller 910. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
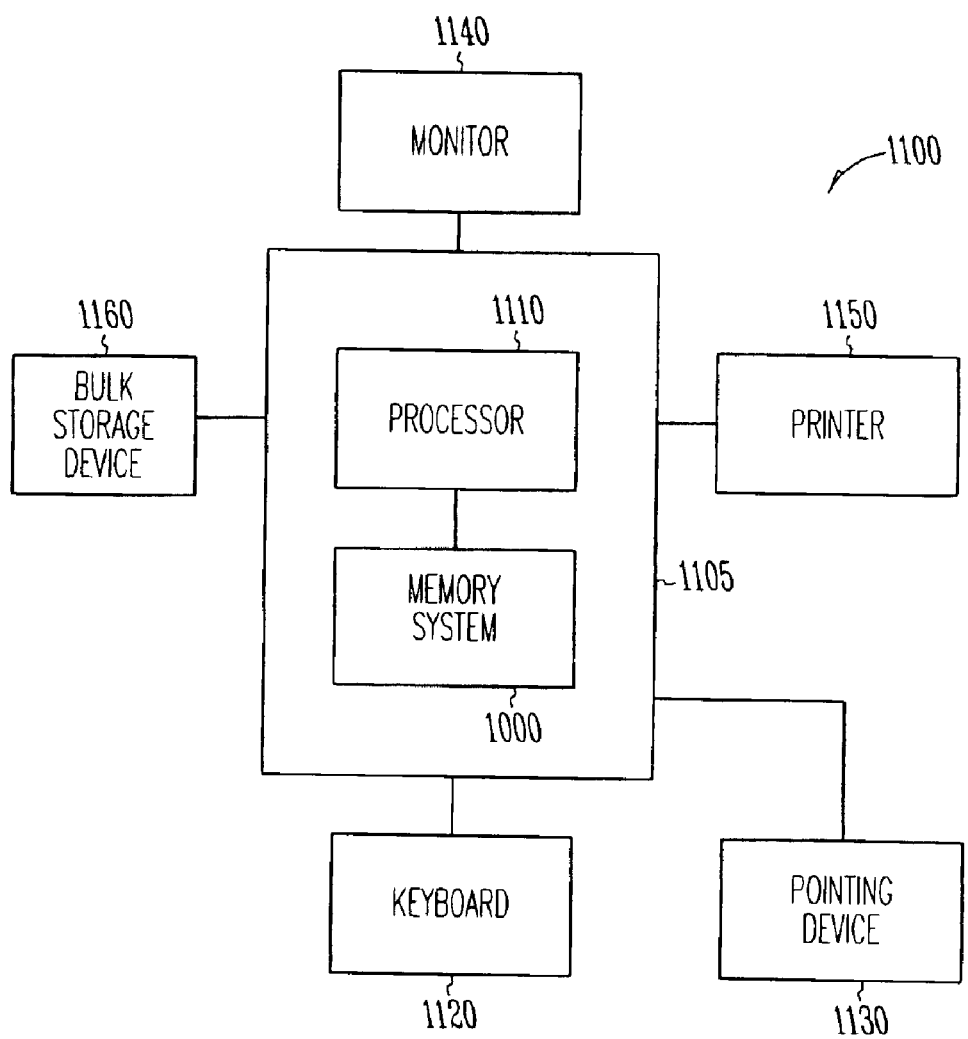
FIG. 11 is a block diagram of one embodiment of a computer system including the input buffer of the present invention.

FIG. 11 shows a further embodiment of an electronic system as a computer system 1100. Computer system 1100 contains a processor 1110 and a memory system 1000 housed in a computer unit 1105. Computer system 1100 is but one example of an electronic system containing another electronic system, i.e. memory system 1000, as a sub-component. Computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with computer system 1100 such as modems, device driver cards, additional storage devices, etc. It will further be appreciated that the processor 1110 and memory system 1000 can include the input buffer circuit according to the teachings of the present invention. Computer system 1100 can be incorporated on a single integrated circuit. Such single package processing units reduce the communication time between the processor and the memory circuit.

CONCLUSION

An input buffer circuit is described which conveniently allows setting any predetermined switching point voltage to provide a switching point voltage that maximizes high and low noise margins of an integrated circuit. The input buffer of the present invention is capable of operating at high speeds while using low power. The input buffer circuit is self-biasing and automatically adjusts to process variations. In one embodiment, the input buffer has an input stage providing a switching point voltage based on a predetermined switching point set between a first and second reference voltages that maximizes the high and low noise margins of the input buffer. The input stage is further coupled to an output stage. The output stage receives the switching point voltage from the input stage and amplifies the switching point voltage to a full logic level voltage.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of providing a switching point voltage for an integrated circuit by using a differential input buffer circuit, comprising:

determining available first and second reference voltages in the integrated circuit;

computing a switching point voltage based on the available first and second reference voltages to maximize high and low noise margins of the integrated circuit; and setting the switching point voltage by sizing transistors in the differential input buffer circuit including cross-coupled pairs of transistors coupled to a supply voltage node and the first and second reference voltages based on the computed switching point voltage.

2. The method of claim 1, further comprising:

sizing transistors in the differential input buffer to a specific speed of operation based on a load driven by the differential input buffer.

3. The method of claim 1, wherein computing the switching point voltage comprises computing the switching point voltage based on ((first reference voltage+second reference voltage)/2).

4. A method of providing a switching point voltage for an integrated circuit by using a differential input buffer circuit, comprising:

determining available first and second reference voltages in the integrated circuit using a supply voltage as the first reference voltage;

computing a switching point voltage based on the available first and second reference voltages to maximize high and low noise margins of the integrated circuit;

setting the switching point voltage by applying the supply voltage across the gate to source voltages of transistors in the differential input buffer circuit including cross-coupled pairs of transistors coupled to the supply voltage node and the first and second reference voltages based on the computed switching point voltage; and providing the switching point voltage based on the set switching point voltage.

5. The method of claim 4, wherein coupling the input stage to the second reference voltage comprises coupling the input stage to ground.

6. The method of claim 4, wherein computing the switching point voltage comprises computing the switching point voltage based on ((first reference voltage+second reference voltage)/2).

7. A method of designing a differential input buffer circuit to provide a switching point voltage for an integrated circuit, comprising:

determining a required switching point voltage for the integrated circuit to maximize high and low noise margins of the integrated circuit;

defining required first and second reference voltages based on the determined switching point voltage; and sizing transistors in the differential input buffer circuit including cross-coupled pairs of transistors coupled to a supply voltage node and the first and second reference voltages to provide the switching point voltage based on the defined first and second reference voltages to maximize high and low noise margins.

8. The method of claim 7, wherein determining a required switching point voltage for the integrated circuit comprises averaging the first and second reference voltages.

* * * * *